United States Patent
Augustine et al.

(10) Patent No.: US 11,450,672 B2
(45) Date of Patent: Sep. 20, 2022

(54) ULTRA-DEEP COMPUTE STATIC RANDOM ACCESS MEMORY WITH HIGH COMPUTE THROUGHPUT AND MULTI-DIRECTIONAL DATA PROPAGATION

(71) Applicant: Intel Corporation, Santa Clara, CA (US)

(72) Inventors: Charles Augustine, Portland, OR (US); Somnath Paul, Hillsboro, OR (US); Muhammad M. Khellah, Tigard, OR (US); Chen Koren, Hadera (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/859,600

(22) Filed: Apr. 27, 2020

(65) Prior Publication Data

US 2020/0258890 A1    Aug. 13, 2020

(51) Int. Cl.
*G11C 17/16* (2006.01)
*H01L 27/11* (2006.01)
*G11C 11/418* (2006.01)
*G11C 11/419* (2006.01)
*G11C 11/412* (2006.01)

(52) U.S. Cl.
CPC .......... *H01L 27/11* (2013.01); *G11C 11/412* (2013.01); *G11C 11/418* (2013.01); *G11C 11/419* (2013.01)

(58) Field of Classification Search
CPC .................................................. G11C 7/1006

USPC ................................................... 711/12.025
See application file for complete search history.

(56) References Cited

U.S. PATENT DOCUMENTS

| | | | |
|---|---|---|---|
| 10,063,407 B1 * | 8/2018 | Kodeboyina | H04L 69/22 |
| 2017/0337156 A1 * | 11/2017 | Yadavalli | G06F 9/30149 |
| 2019/0198093 A1 | 6/2019 | Khellah et al. | |
| 2019/0228809 A1 * | 7/2019 | Srinivasan | G06N 3/08 |
| 2019/0237137 A1 * | 8/2019 | Buchanan | G11C 11/1659 |
| 2020/0026498 A1 | 1/2020 | Sumbul et al. | |

FOREIGN PATENT DOCUMENTS

| | | |
|---|---|---|
| EP | 3686734 A1 | 7/2020 |
| WO | 2019015541 A1 | 1/2019 |

OTHER PUBLICATIONS

Extended European Search Report for U.S. Appl. No. 16/859,600, dated May 19, 2021, 9 pages.

* cited by examiner

*Primary Examiner* — Min Huang
(74) *Attorney, Agent, or Firm* — Compass IP Law, PC (57) ABSTRACT

An ultra-deep compute Static Random Access Memory (SRAM) with high compute throughput and multi-directional data transfer capability is provided. Compute units are placed in both horizontal and vertical directions to achieve a symmetric layout while enabling communication between the compute units. An SRAM array supports simultaneous read and write to the left and right section of the same SRAM subarray by duplicating pre-decoding logic inside the SRAM array. This allows applications with non-overlapping read and write address spaces to have twice the bandwidth as compared to a baseline SRAM array.

18 Claims, 12 Drawing Sheets

ULTRA-DEEP COMPUTE STATIC RANDOM ACCESS MEMORY WITH HIGH COMPUTE THROUGHPUT AND MULTI-DIRECTIONAL DATA PROPAGATION

FIELD

This disclosure relates to machine learning and in particular to compute near memory.

BACKGROUND

In a deep learning system, a neural network model is stored in memory and computational logic in a processor performs multiply-and-accumulate (MAC) computations on the parameters (for example, weights) stored in the memory. Data transfer between memory and the processor is an energy-intensive process and can consume a large percentage of the power in machine learning workloads.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

Memory bandwidth can be improved through the use of compute near memory. For example, compute units can directly access Static Random Access Memory (SRAM) without sharing bandwidth with other compute units. As a result, compute units can be activated simultaneously without the overhead of waiting for the opportunity. Moreover, the technique of compute near memory saves power by reducing data movement since compute units are now closer to SRAM. However, as more and more deep computations are enabled, memory bandwidth and layout constraints will limit the extent to which power saving can be achieved. Deep computations denote that compute units are physically embedded deep inside the SRAM array blocks. For example, 16 compute units can share 256 KiloBytes (KB) of SRAM. This compute (16 MAC) and memory (256 KB) unit is replicated multiple times to achieve higher performance. One compute (16 MAC) and memory (256 KB) unit will be described. However, proposed innovations are applicable in the repeated units as well. A further increase in compute units is limited by memory bandwidth (128 bits per cycle) from 256 KB.

An ultra-deep compute SRAM with higher compute throughput and multi-directional data transfer capability called Horizontal-Vertical SRAM (HV-SRAM) enables layout and floorplan friendly Ultra-Deep Compute SRAM (UDC-SRAM). Compute units are placed in both a horizontal direction and a vertical direction to achieve a symmetric layout while enabling communication between the compute units. Metal tracks available on the HV-SRAM are used to route data from/to SRAM both in horizontal metal tracks (M4 or M6) and vertical metal tracks (M5 or M7). Compared to a baseline case where compute is restricted to one direction (horizontal), which results in a skewed aspect ratio (that is, Aspect Ratio=x-dimension/y-dimension>>1) for Ultra-Deep Compute SRAM, the Horizontal-Vertical SRAM enables a more balanced aspect ratio. The SRAM array supports simultaneous read and write to the left and right section of the same SRAM subarray by duplicating pre-decoding logic inside the SRAM array. This allows applications with non-overlapping read and write address spaces to have twice the bandwidth as compared to the baseline SRAM array.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Figure 1:
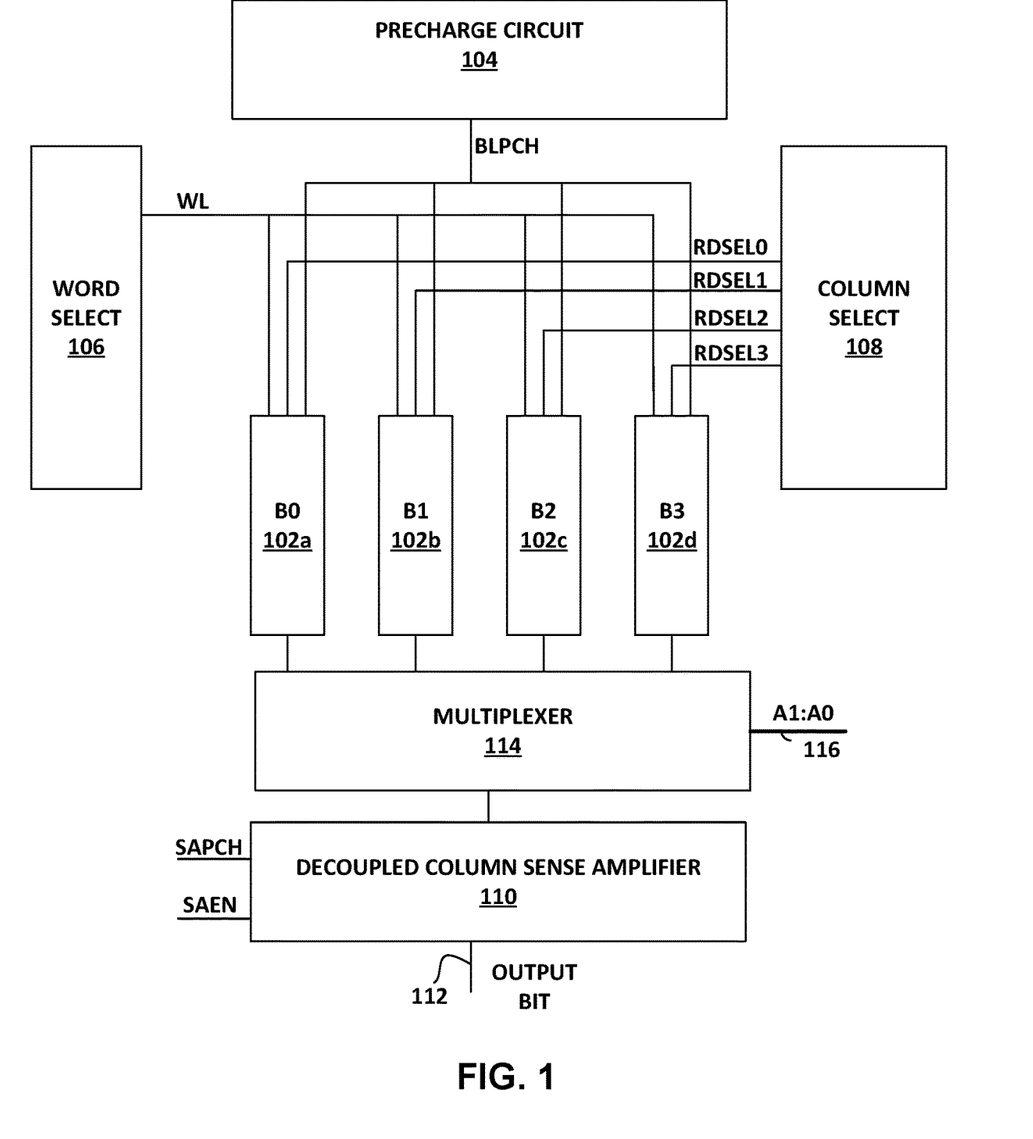
FIG. 1 is a block diagram of a portion of an SRAM array.

FIG. 1 is a block diagram of a portion of a high-bandwidth SRAM array 100. The high-bandwidth SRAM array 100 includes a plurality of SRAM cells organized in rows and columns. The portion of the high-bandwidth SRAM array 100 shown in FIG. 1 includes four SRAM cells 102a-102b in one row of the high-bandwidth SRAM array 100. Each SRAM cell 102a-102d can store one bit B0-B3. An SRAM cell 102a-102b can include six transistors (6T) and has two stable states to denote logical 1 or 0. The state is stored on four of the six transistors that form two cross-coupled inventors. The other two transistors in the SRAM cell 102a-d control access during read and write operations.

A single bit B0-B3 can be read or written from one of the plurality of SRAM cells 102a-d by selecting the column (bit line) and row (word line) for the respective SRAM cell 102a-d in column select circuitry 108 and word select circuitry based on the state of address bits. To read a single bit B0-B3 from an SRAM cell 102a-d in the selected word line (WL), all columns in the selected word line are pre-charged via a Bit Line Pre-charge signal (BLPCH) that is output from pre-charge circuit 104 and the bit B0-B3 that is read from the SRAM cell 102a-d is selected by a multiplexer 114 dependent on the state of multiplexer select signal 116. In an embodiment, the multiplexor select signal 116 is generated by an address decoder based on the state (00, 01, 10, 11) of the two Least Significant Bits (LSBs) (A1:A0) of the SRAM address to select one of the four bits B0-B3. A sense amplifier 110 converts the differential signal that is output from the selected SRAM cell 102a-d and selected by the multiplexer 114 to a logical 0 or 1 on bit output 112.

Although only a single bit in a single column of bit cells in the row is read or written in a given read or write cycle, the non-selected bits in the row are pre-charged. If the access pattern to the high-bandwidth SRAM 100 is to access consecutive bits (for example, consecutive matrix elements for matrix operations performed for applications such as image processing, deep neural networks, and scientific computing workloads), memory bandwidth is improved by reading the other pre-charged bits in the same row (word line) with burst access.

One of the consecutive bits B0-B3 in the selected word line is selected by a decoupled sense amplifier 110 by asserting the respective Read Select (RDYSEL0-3) signals and the selected bit is output from the decoupled sense amplifier 110 based on the state of the sense amplifier pre-charge (SAPCH) and sense amplifier enable (SAEN) signals.

Figure 2:
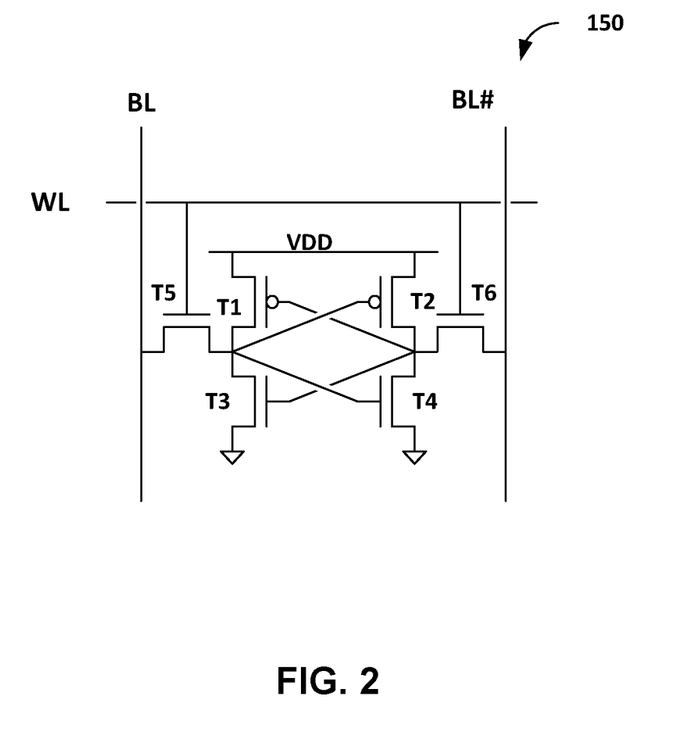
FIG. 2 is an embodiment of an SRAM cell in the SRAM array that includes six transistors.

FIG. 2 is an embodiment of the SRAM cell 102a-d that includes six transistors. Each transistor may be a metal-oxide-semiconductor field-effect transistor (MOSFET). Transistors T1 and T2 are P-channel MOSFET (NMOS) transistors and transistors T3, T4, T5 and T6 are N-channel MOSFET (PMOS) transistors. Each bit in the 6T SRAM cell 150 is stored in a storage cell comprising four transistors (T1, T2, T3, T4) that form two cross-coupled inverters. The storage cell has two stable states which are used to store a logic 0 or logic 1.

Two additional access transistors T5 and T6 control access to the storage cell during read and write operations. The access transistors T5 and T6 are turned on whenever a word line (WL) is activated for read or write operation, connecting the storage cell to the complementary bit lines (BL, BL #). When the word line is not activated, the access transistors T5 and T6 are turned off and the data is retained in the storage cell while power is applied to the 6T SRAM cell 150.

The decoupled sense amplifier 110 converts the local bit line voltage to a full-swing signal. In another embodiment, an SRAM cell may have 8, 10, and upto 12 transistors per memory cell (bit).

Figure 3:
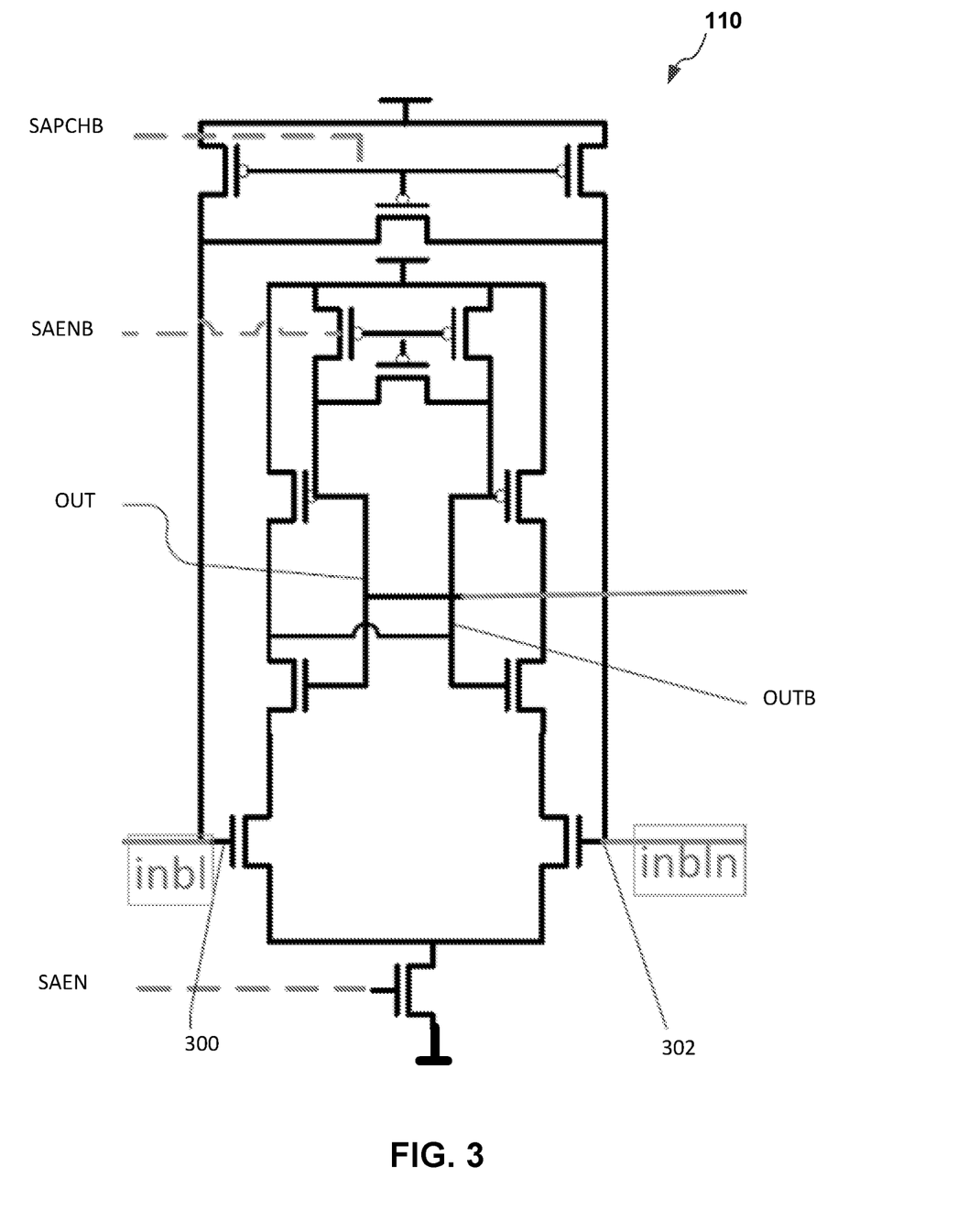
FIG. 3 is a circuit diagram of an embodiment of the decoupled sense amplifier.

FIG. 3 is a circuit diagram of an embodiment of the decoupled sense amplifier 110. The decoupled sense amplifier 110 includes input terminals (INBL, INBLB) 300, 302, that are separate from the output terminal (OUT).

Figure 4A:
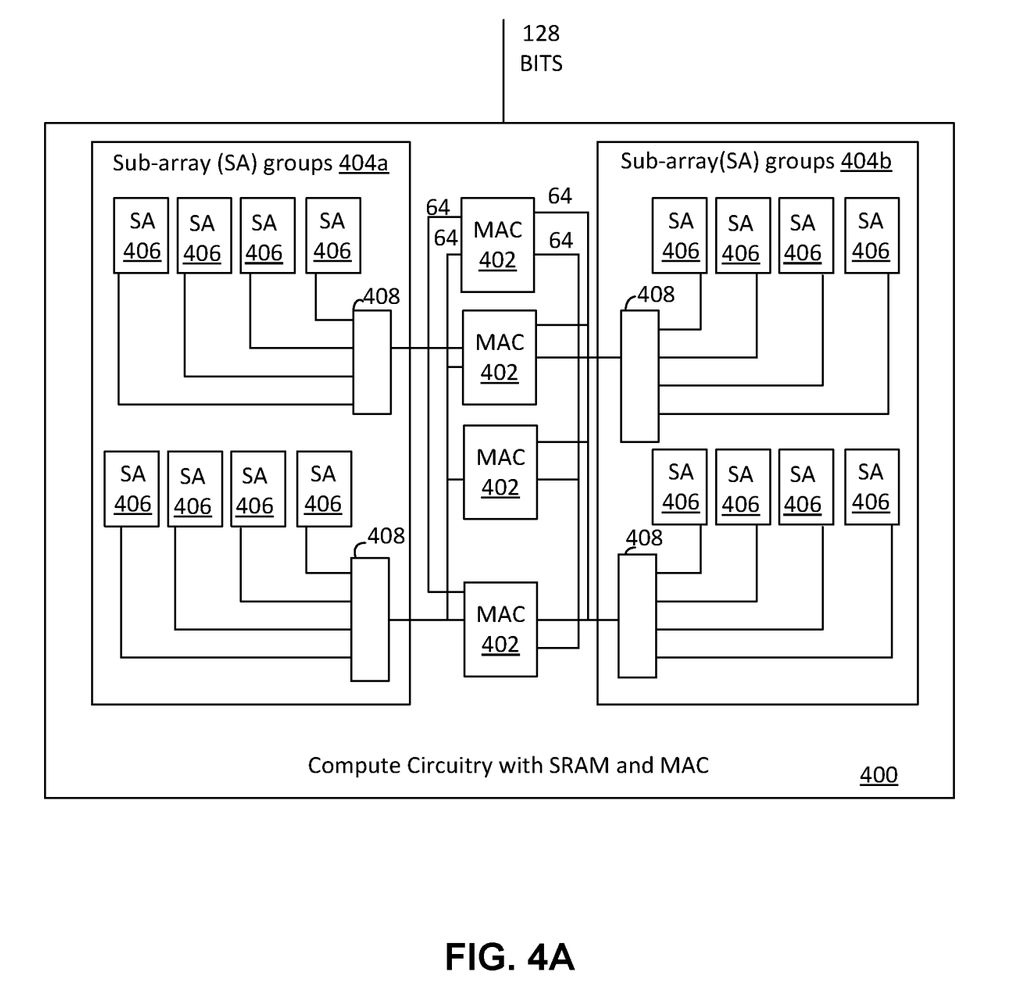
FIG. 4A is an embodiment of a Compute SRAM that includes 16 Multiply-and-Accumulate (MAC) units and 256 Kilo Bytes (KB) of the high-bandwidth SRAM described in conjunction with FIG. 1, FIG. 2 and FIG. 3.

FIG. 4A is an embodiment of a Compute Circuitry with 16 SRAM and Multiply-and-Accumulate units 400 that includes Multiply-and-Accumulate (MAC) units 402 and 256 Kilo Bytes (KB) of the high-bandwidth SRAM 100 described in conjunction with FIG. 1 and FIG. 2. Four Multiply-and-Accumulate units 402 are shown in FIG. 4A. Each of the Multiply-and-Accumulate units 402 performs 16 Multiply-and-Accumulate operations on the two 8-bytes (64-bits) read from the high-bandwidth SRAM 100.

As shown in FIG. 4, the high-bandwidth SRAM (a memory circuit) includes a first group of sub-arrays 404a and a second group of sub-arrays 404b to store data. Each group of sub-arrays 404a, 404b includes a plurality of sub-arrays 406 organized as two rows and four columns of sub-arrays 406. Each sub-array 406 includes a plurality of memory cells 102a-d. To achieve a read throughput of 128 bits per clock cycle (clock period) from the Compute Circuitry with SRAM and Multiply-and-Accumulate units 400, a ping-pong read operation is performed between the two groups of sub-arrays 404a, 404b. The ping-pong read operation allows computation of 16 Multiply-and Accumulate operations per clock cycle with 8 bit precision to provide 128 bits of data read from the Compute Circuitry with SRAM and Multiply-and-Accumulate units SRAM 400 per clock cycle. Each of the groups of sub-arrays 404a, 404b has a latency and throughput of 2 clock cycles. This latency and throughput allows for fast speed (3 Giga Hertz+) operation.

The high throughput provided by the burst SRAM described in conjunction with FIGS. 1, 2 and 3 enables 100% utilization of the Multiply-and-Accumulate (MAC) units 402 shown in FIG. 4 to perform a multiply-and-accumulate operation using the data stored in the groups of sub-arrays 404a, 404ob which can perform 16 to 32 Multiply-and-Accumulate operations in every clock cycle.

Figure 4B:
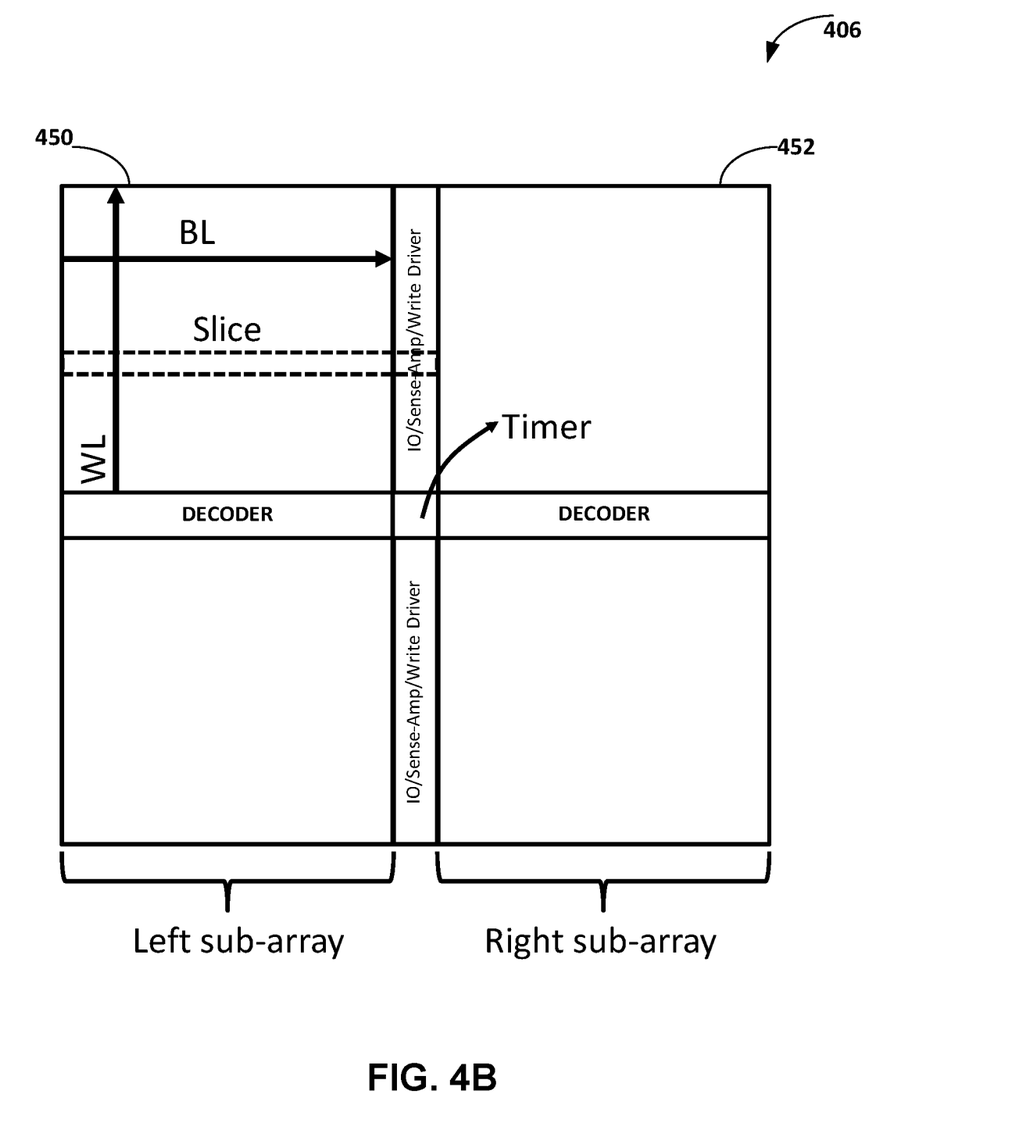
FIG. 4B is an embodiment of any one of the sub-arrays shown in FIG. 4A.

FIG. 4B is an embodiment of any one of the sub-arrays 406 shown in FIG. 4A. In an embodiment, the sub-array 406 is a 16K (2K×64 bits) SRAM. The SRAM cells in the sub-array 406 are in a left side (left sub-array) 450 and a right side 452 (right sub-array) of the sub-array 406.

Figure 5:
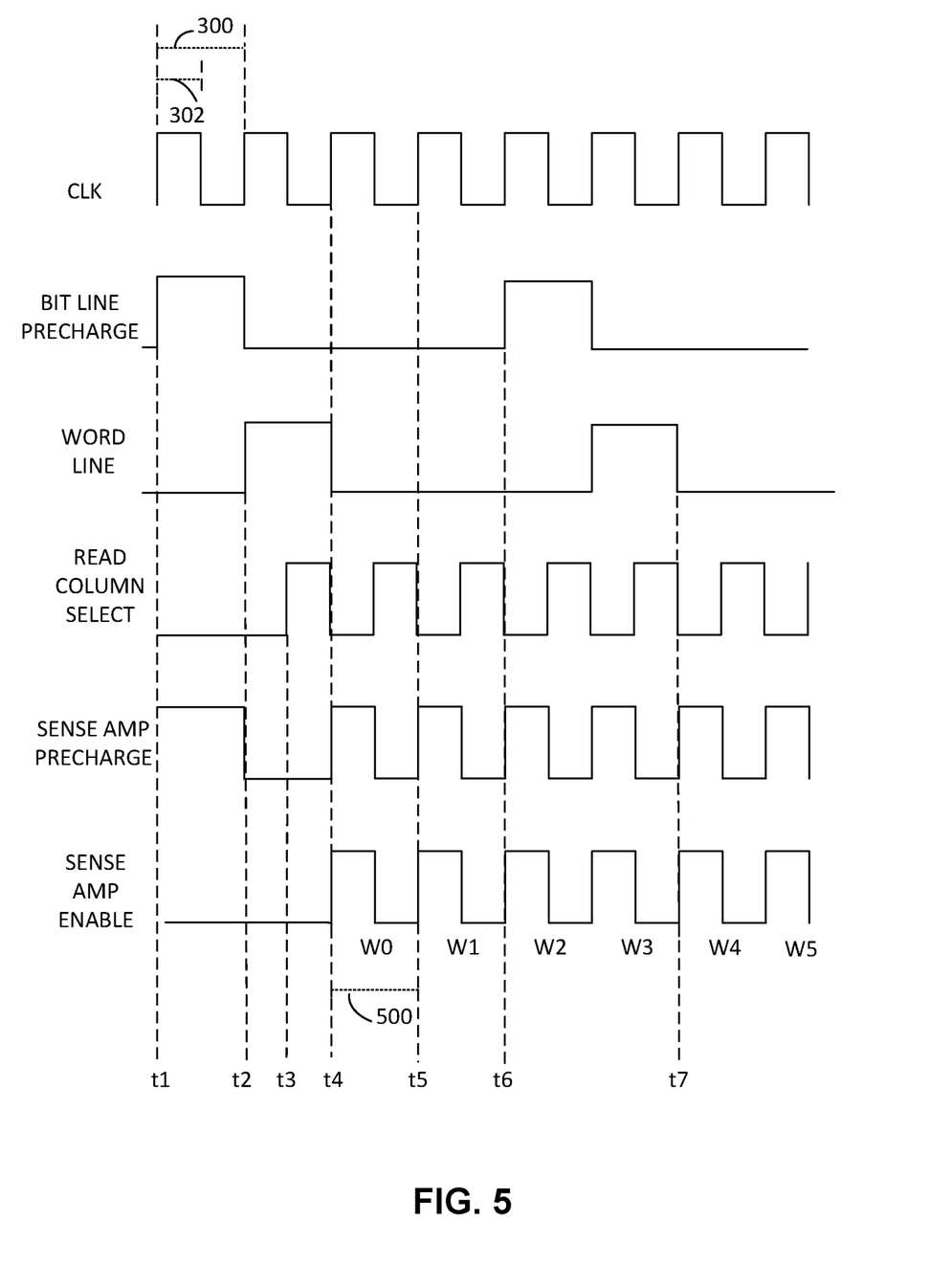
FIG. 5 is a timing diagram illustrating an embodiment of a read access of consecutive bit cells in a same row (word line) in the Deep Compute Circuitry with SRAM and Multiply-and-Accumulate units shown in FIG. 4.

FIG. 5 is a timing diagram illustrating an embodiment of a read access of consecutive bit cells in a same row (word line) in the Compute Circuitry with SRAM and Multiply-and-Accumulate units 400 shown in FIG. 4. Each clock cycle 300 of the clock signal (CLK) has two phases 302. The high-bandwidth SRAM 100 can also be referred to as a burst SRAM.

The first group of sub-arrays 404a and the second group of sub-arrays 404b can operate in parallel. In burst mode, the first group of sub-arrays 404a and the second group of sub-arrays 404b can be independently operated. The first 4 words can be read from the first group of sub-arrays 404a and at the same time 4 words can be read from the second group of sub-arrays 404b and are sent to different MAC units 402. The timing diagram will be described for read access from the first group of sub-arrays 404a in burst mode. In non-burst mode, the read access from the first group of sub-arrays 404a and the second group of sub-arrays 404b is performed in tandem in alternate cycles to compensate for 2 cycle throughput).

At time t1, the Bit Line Pre-Charge (BLPCH) signal is asserted to charge the bits for the first four 64 bit words in the first group of sub-arrays 404a shown in FIG. 4.

At time t2, one clock period (clock cycle) after the bit line pre-charge signal is asserted, the word line signal is asserted to read the first 64-bit word.

At time t3, 1.5 clock cycles after the bit line pre-charge signal is asserted, the read column select is asserted to read the first 64-bit word.

At time t4, two clock cycles after the bit line pre-charge signal is asserted, the sense amplifier pre-charge signal and the sense amplifier enable signal are asserted to output the first four 64-bit word from the first group of sub-arrays 404*a*.

At time t5, one clock cycle 300 after time t4, the second 64-bit word is output from the first group of sub-arrays 404*a*.

At time t6, the bit line pre-charge signal to charge the bits for the second group of four 64 bit words is asserted in the first group of sub-arrays 404*a* shown in FIG. 3.

At time t7, two clock cycles after the bit line pre-charge signal is asserted, when operating in non-burst access mode, the sense amplifier pre-charge signal and the sense amplifier enable signal are asserted to output the first four 64-bit words from the second group of sub-arrays 404*b*. When operating in non-burst access mode, both sub-array groups 404*a*, 4040*b* operate in tandem to access 128 bits per clock cycle (that is, 128 bits per two clock cycles from sub-array groups 404*a* and 128 bits per two clock cycles from sub-array groups 404*b*). In burst access mode, 128 bits per clock cycle is accessed from same two sub-arrays 406. In burst access mode, one of the two sub-array groups 404*a*, 404*b* can be activated at any time or the compute can be increased to 32 MAC/cycle instead of 16 MAC/cycle.

When operating in burst access mode, the first 4 64-bit words are output from the first group of sub-arrays 404*a* (from the left side 450 of each sub-array 406 in FIG. 4B) between time t4 and t7 with each 64-bit word output per clock cycle. The second 4 64-bit words are output from the first group of sub-arrays 404*a* (from the right side 452 of each sub-array 406 in FIG. 4B) in four clock cycles starting at time t7. By splitting the read of the eight 64-bit words between the two sides of each sub-array 406 in the first group of sub-arrays 404*a*, eight 64-bit words are read from the SRAM in eight clock cycles which is twice the throughput from a single SRAM (four 64-bit words in eight clock cycles).

This increased throughput also comes with energy saving of 35% by reading all four bits shared by same pre-charge signal as discussed in conjunction with FIG. 1, which is an additional savings to improve the energy efficiency. The read of one 64 bit word per clock cycle is enabled by the de-coupled sense amplifier 110 described in conjunction with FIG. 1 and FIG. 2 and a 3 bit state-machine to enable 8 contiguous read addresses. The state-machine can be embedded inside the SRAM. Sixteen contiguous read operations can be performed with the first eight from the first group of sub-arrays 404*a* and the other eight from the second group of sub-arrays 404*b*, assuming that data has been stored sequentially in the SRAM by the application (software) that is storing data in the SRAM.

As shown in FIG. 5, the word line (WL) is asserted for one clock cycle and pseudo bit line differentials are exploited to enable higher throughput and save energy dissipation. The 35% energy savings is due to reuse of pseudo-bit line differentials from the same column-multiplexer. As discussed in conjunction with FIG. 1, RDSEL0-3 signals are activated one after another to read four words.

The compute throughput of a deep compute SRAM can be further increased by operating the decoupled sense amplifier 110 at twice the clock frequency. This optimization is based on the observation that during a read operation in the deep compute SRAM, the bit-line differential (word line is asserted (WL=1)) is the bottleneck. The decoupled sense-amplifier can be operated at twice the clock frequency because the bit-line differential is developed already by enabling the word line (WL) for one clock cycle. However, for conservative estimation, the frequency of the clock is reduced by 25%, which results in a burst throughput of 4×*0.75=3×.

Figure 6:
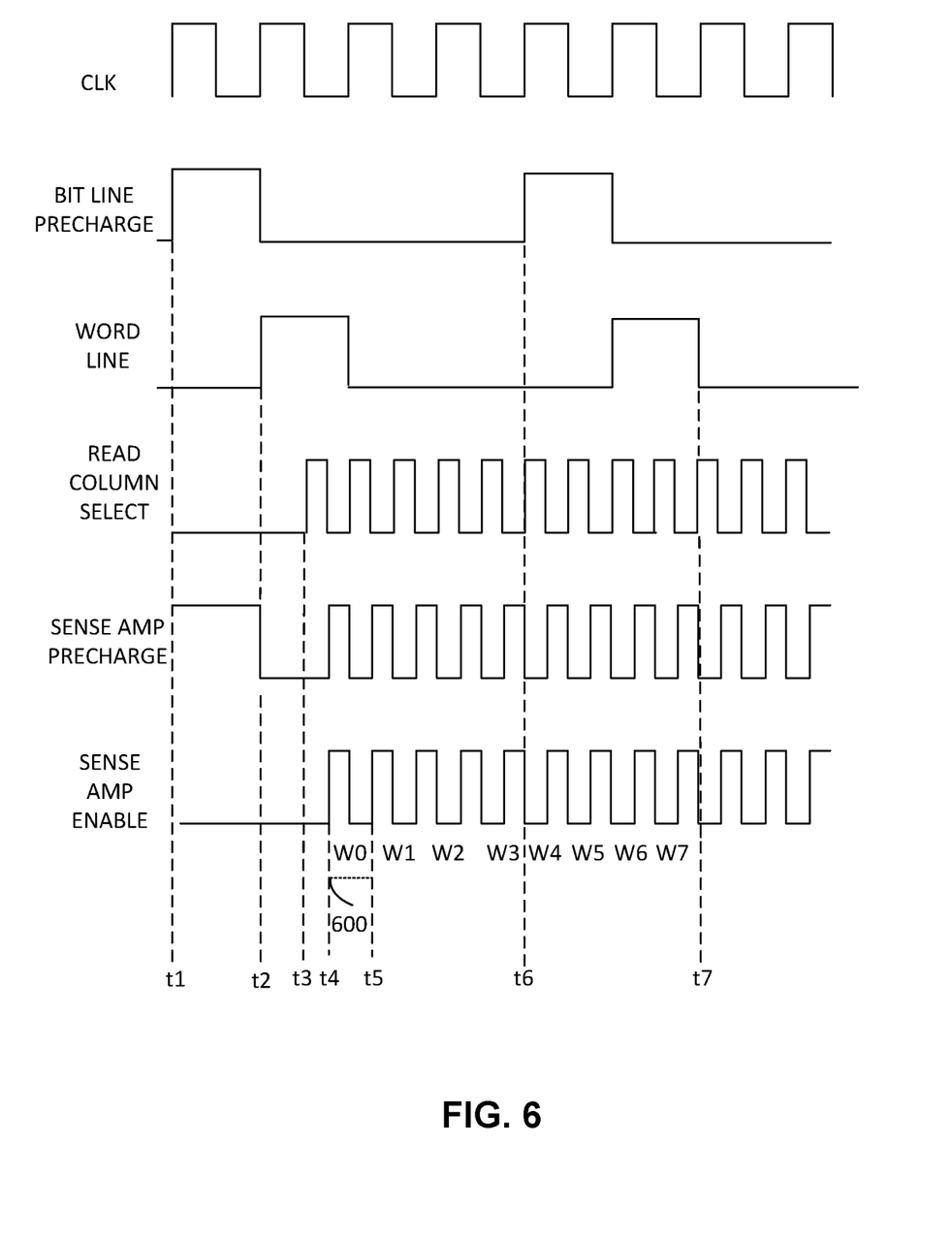
FIG. 6 is a timing diagram illustrating an embodiment of a read access of consecutive bit cells in a same row (word line) in the Deep Compute Circuitry with SRAM and Multiply-and-Accumulate units shown in FIG. 4 and the decoupled sense-amplifier operating at twice the clock frequency.

FIG. 6 is a timing diagram illustrating an embodiment of a read access of consecutive bit cells in a same row (word line) in the Compute Circuitry with SRAM and Multiply-and-Accumulate units 400 shown in FIG. 4 and the decoupled sense amplifier 110 operating at twice the clock frequency.

At time t1, the bit line charge signal to charge the bits for the first four 64 bit words is asserted in first group of sub-arrays 404*a* shown in FIG. 4.

At time t2, one clock period (clock cycle) after the bit line charge signal is asserted, the word line signal is asserted to read the first 64-bit word.

At time t3, 1.5 clock cycles after the bit line charge signal is asserted, the read column select is asserted to read the first 64-bit word.

At time t4, two clock cycles after the bit line charge signal is asserted, the sense amplifier pre-charge signal and the sense amplifier enable signal are asserted to output the first 64-bit word from the first group of sub-arrays 404*a* (from the left side 450 of each sub-array 406 in FIG. 4B).

At time t5, 0.5 clock cycles (one phase 302 of the CLK) after the first 64-bit word is output, the second 64-bit word is output from the first group of sub-arrays 404*a* (from the left side 450 of each sub-array 406 in FIG. 4B).

At time t6, the bit line charge signal to charge the bits for the second four 64 bit words can be asserted in the first group of sub-arrays 404*a* shown in FIG. 4A in the opposite side (right side 452) of same sub-array 406 as discussed in conjunction with FIG. 4B.

At time t7, two clock cycles after the bit line charge signal is asserted, the sense amplifier pre-charge signal and the sense amplifier enable signal are asserted to output the first four 64-bit word from the right side of the first group of sub-arrays 404*a*.

The first 4 64-bit words are output from the first group of sub-arrays 404*a* between time t4 and t6 with each 64-bit word output per half clock cycle. The second 4 64-bit words are output from the first group of sub-arrays 404*a* in two clock cycles starting at time t7. By splitting the read of the eight 64-bit words between the two sides of each sub-array 406 in the first group of sub-arrays and operating the decoupled sense amplifier 110 at twice the clock frequency, the eight 64-bit words are read from the SRAM in four clock cycles.

The embodiment described in conjunction with FIG. 4A includes two sub-array groups 404*a*, 404*b*, with each respective sub-array group 404*a*, 404*b* including eight 16K sub-arrays 406 arranged as four columns and two rows. During each clock cycle, two of the eight sub-arrays 406 in each sub-array group 404*a*, 4040*b* are active and the other six sub-arrays 406 are idle. One sub-array 406 from each of the two rows in the sub-array group 404*a*, 404*b* provides 64 bits (a total of 128 bits from the two rows) which is input to the MAC units 402. Sub-array group 404*a* and sub-array group 404*b* provides 128 bits of data in alternate cycle since because each sub-array group 404*a*, 404*b* has a throughput of two clock cycles. In this embodiment, there are 16 MAC units 402 (4 of the 16 MAC units 402 are shown in FIG. 4A.

Figure 7:
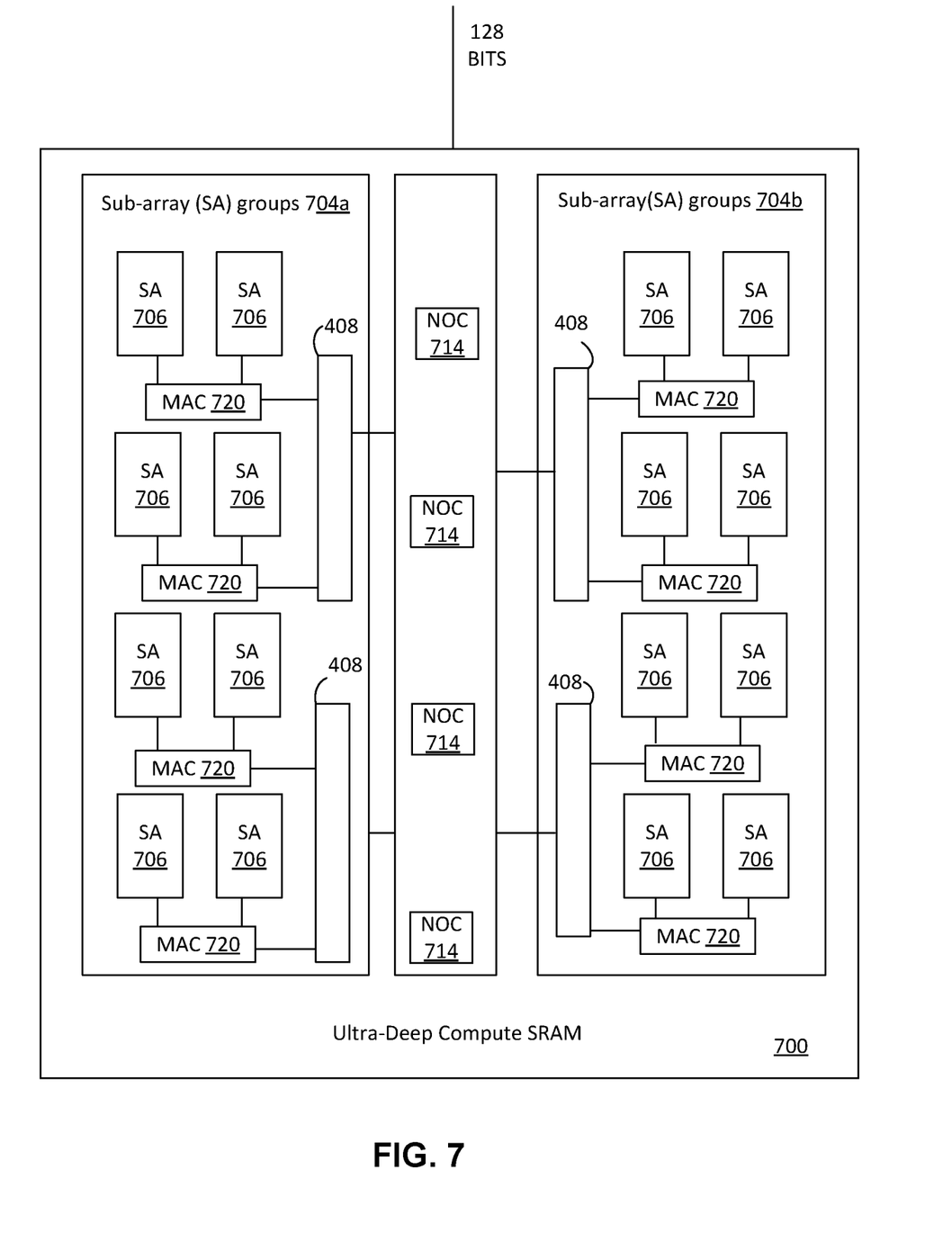
FIG. 7 is an embodiment of an Ultra-Deep Compute SRAM.

FIG. 7 is an embodiment of an Ultra-Deep Compute SRAM 700. The ultra-deep compute SRAM 700 with higher compute throughput and multi-directional data transfer capability referred to as Horizontal-Vertical SRAM (HV-SRAM) enables layout and floorplan friendly Ultra-Deep Compute SRAM (UDC-SRAM). To improve the aspect ratio, Multiply-and-Accumulate (MAC) units 720 are placed in both horizontal and vertical directions to achieve a symmetric layout while enabling communication between the Multiply-and-Accumulate (MAC) units 720. Metal tracks available on the HV-SRAM are used to route data from/to SRAM both in horizontal (M4 or M6) and vertical directions (M5 or M7). The Horizontal-Vertical SRAM enables a more balanced aspect ratio.

In the embodiment shown in FIG. 7, there are 128 MAC operations per clock cycle performed by Multiply-and-Accumulate (MAC) units 720. The Ultra-Deep Compute SRAM 700 includes 256 Kilobytes (KB) of the high-bandwidth SRAM 100 described in conjunction with FIG. 1 and FIG. 2.

Ultra-Deep Compute SRAM 700 that includes 128 Multiply-and-Accumulate (MAC) units organized as eight Multiply-and-Accumulate (MAC) units 720 and 256 Kilo Bytes (KB) of the high-bandwidth SRAM 100 described in conjunction with FIG. 1 and FIG. 2. The high-bandwidth SRAM includes a first group of sub-arrays 704a and a second group of sub-arrays 704b. Each group of sub-arrays 704a, 704b includes a plurality of sub-arrays 706.

The interconnect required to support the additional vertical Multiply-and-Accumulate (MAC) units 720 computations can be enabled using the vertical M5 (or M7) metal tracks available on the top of the high-bandwidth SRAM without consuming additional layout resources. In this case M5 metal tracks are shorted to existing M4 (or M6) metal tracks. In an embodiment with 8 Mega Byte (MB) SRAM, the aspect ratio is 1.34.

Multiply-and-Accumulate (MAC) units 720 can communicate via a Network-On-Chip (NOC) 714. The NOC 714 allows communication between MAC units 720 because the output of one of the MAC units 720 can be used as input by another of the MAC units 720. The NOC 714 enables flexibility of computation. Communication enabled by the NOC 714 allows different compute kernels, for example, inner-product, similarity search to be mapped on the Ultra-Deep Compute SRAM 700.

Table 1 below illustrates a plurality of embodiments of ultra-deep compute SRAM.

TABLE 1

|  | Number of physical MACs | Effective number of MACs per cycle | Aspect Ratio |
| --- | --- | --- | --- |
| 1X compute | 16 | 16 | 1.62 |
| 4X compute | 64 | 64 | 2.44 |
| 4X compute plus 2X Burst | 128 | 128 | 2.44 |
| 8X compute plus 4X Burst | 256 | 192 | 3.54 |
| 8X Compute plus 4X Burst plus HV-SRAM plus NOC | 256 | 192 | 1.34 |

With 1× compute, there are 16 physical MACs and 16 effective number of MACs per cycle. Compute resources can be increased by increasing the number of Multiply-and-Accumulate (MAC) units 402 from 16 to 64 to provide 64 effective number of MACs per cycle.

Compute resources can be further increased by increasing the number of Multiply-and-Accumulate (MAC) units 402 to 128 and operating the deep compute SRAM 700 in 2× burst mode with each sub-array group capable to provide 128 bits in parallel. An increase to 128 MAC units 402 is possible because every column in (4 columns in each sub-array group 404a, 404b) can provide 128 bits thus supporting 128 multipliers (4 columns×32).

Compute resources can be further increased by increasing the number of Multiply-and-Accumulate (MAC) units 402 to 256 and operating the deep compute SRAM 700 in 4× burst mode with each sub-array group with two sub-arrays is capable to provide 128 bytes in parallel for a total 256 bytes. The effective increase in compute is 0.75×256=192 MAC/16=12×.

A floorplan of an integrated circuit is a schematics representation of tentative placement of its major functional blocks. The increase in the number of MAC units results in an aspect ratio (ratio of x to y) that has a greater x-dimension than a y-dimension that makes it more difficult to generate a floorplan for the high-bandwidth SRAM 100. In an integrated circuit that includes 8 Mega Bytes (MB) of SRAM with 8 rows and 4 columns of 256 KB SRAMs, the aspect ratio of 8× compute (the number of Multiply-and-Accumulate (MAC) units)+4× throughput is 3.54 vs. 1.62 of an integrated circuit with an aspect ratio of 1× compute+1× throughput.

Figure 8:
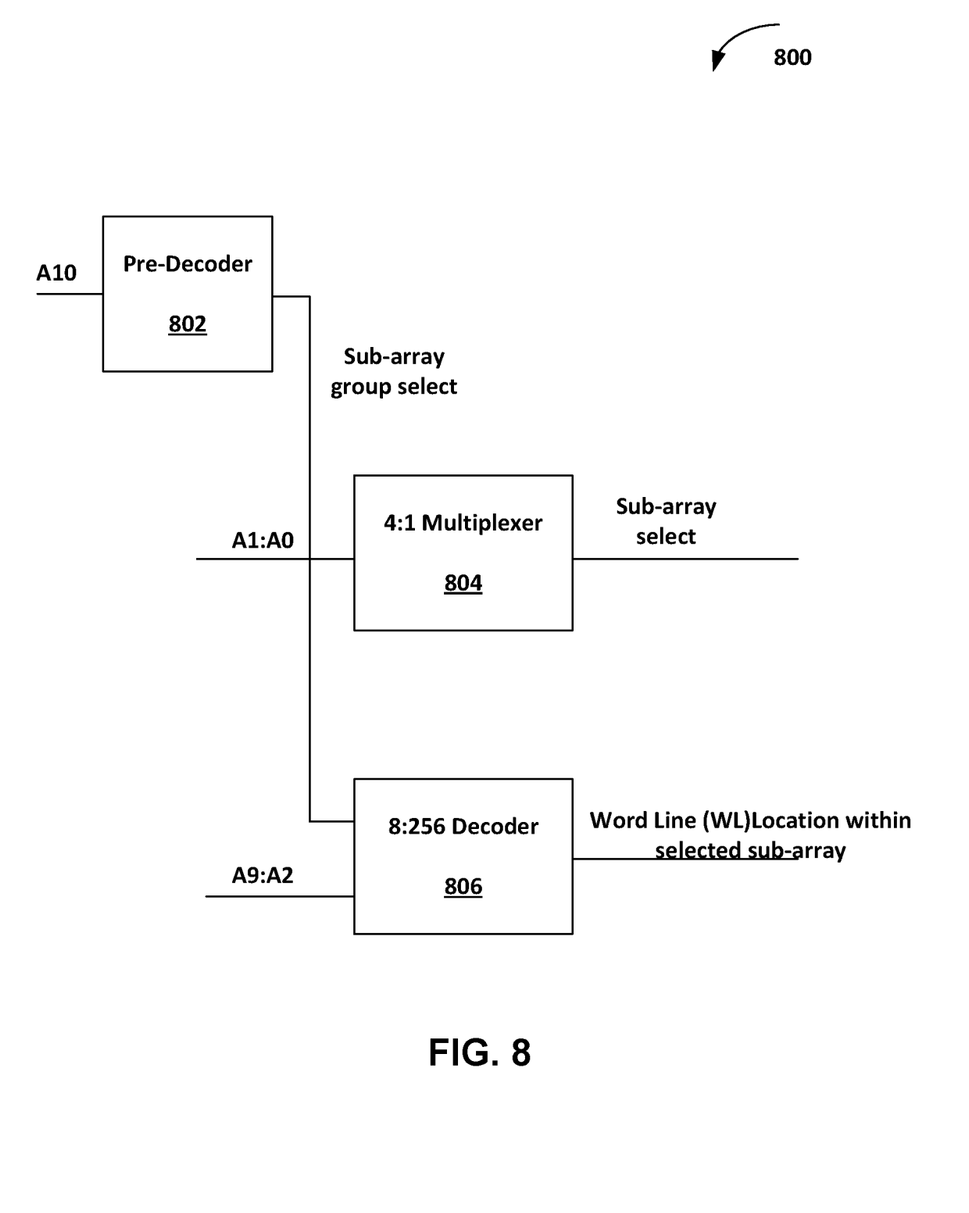
FIGS. 8-10 illustrate circuitry in the Ultra-Deep Compute SRAM to support simultaneous read and write to the same SRAM sub-array to allow partial/final outputs to be stored in the SRAM array.
Figure 9:
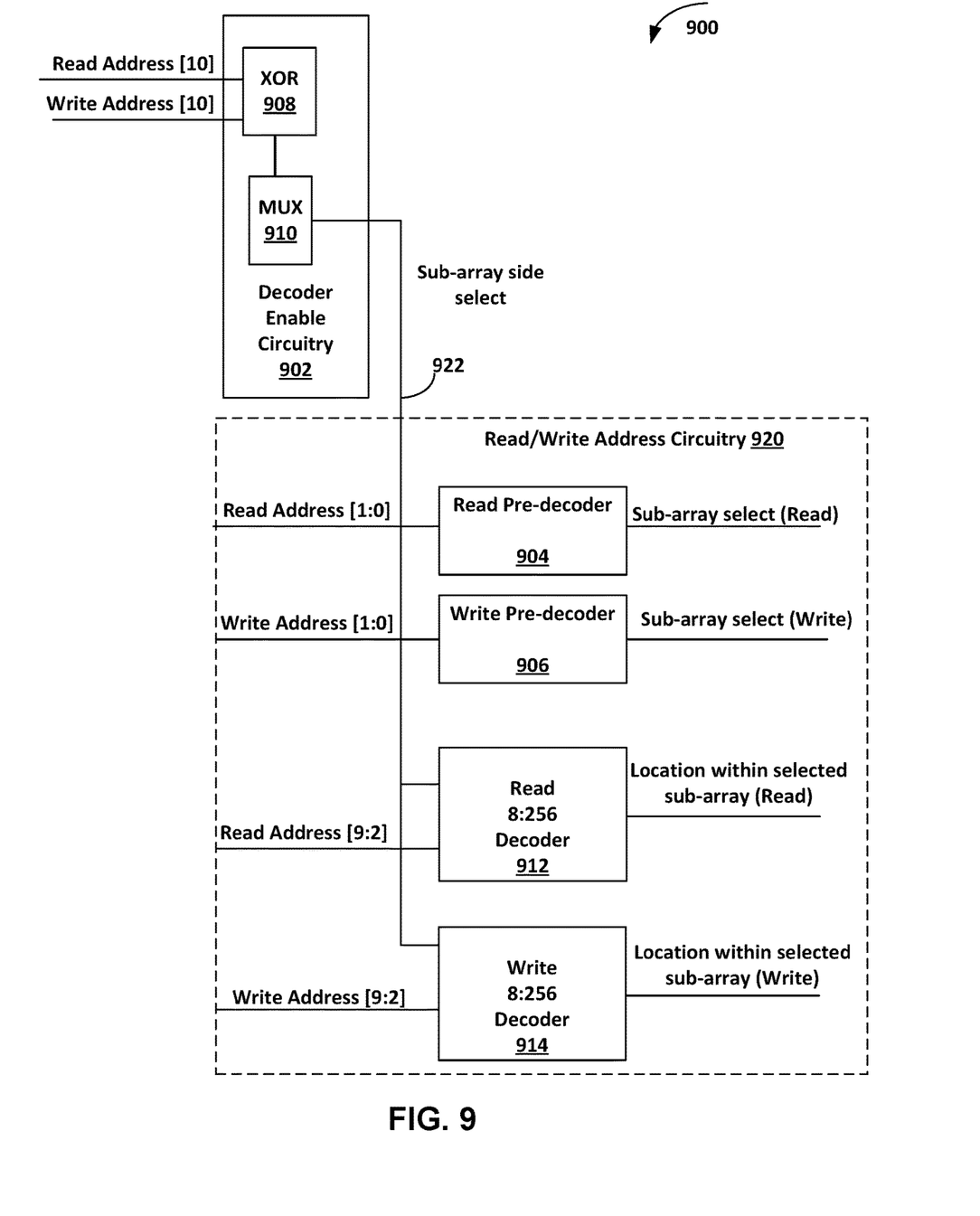
Figure 10:
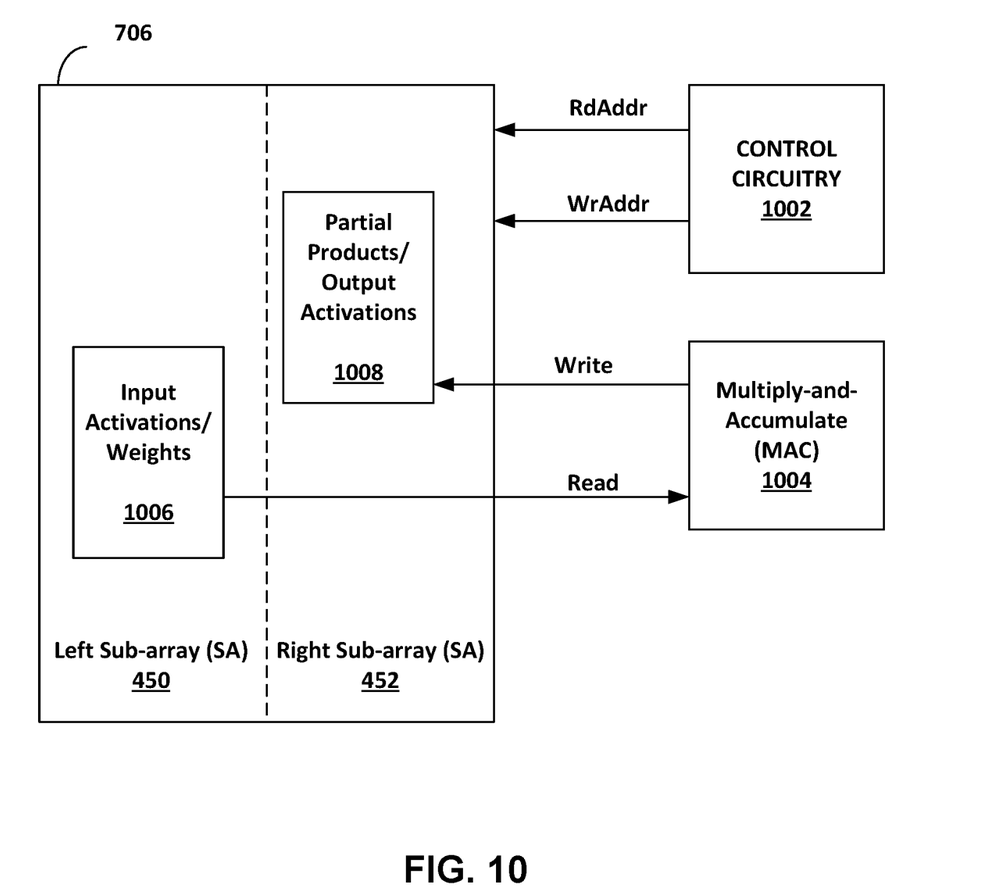

FIGS. 8-10 illustrate circuitry in the Ultra-Deep Compute SRAM 700 to support simultaneous read and write to the same sub-array 706 to allow partial/final outputs to be stored in the SRAM array.

Turning to FIG. 8, address decode circuitry 800 includes a pre-decoder 802, a multiplexor 804 and a decoder 806. In an embodiment with a 16 KB SRAM, the left and right side of the sub-array 706 can be simultaneously read as discussed earlier. The 16 KB sub-array 706 is organized as 2K×64 bits and uses 11 address bits (A10:A0) to select a location of a word stored in the 16 KB SRAM. Address bit A[10] is used to distinguish between left and right side of the 16 KB SRAM sub-array (8 KB SRAM per side). Address bits A[9:0] are used to select the location of a word within the 8 KB SRAM (that is, to select one word among 1K)

The state of the Most Significant Bit (MSB) of the address (A10) input to pre-decoder 802 is used to select between two sides of the sub-array 706 similar to sub-array 406 described in conjunction with FIG. 4B, that may also be referred to as the left side 452 of sub-array 406 (FIG. 4B) or the right side 450 of sub-array 406 (FIG. 4B). The state of address bits A1:A0 are used as select signals for the multiplexor 804 (a 4:1 column multiplexor) and the eight higher address bits (A9:A2) are used as inputs to the decoder 806 to select the write line (WL) location in the sub-array 706 to be read or written.

Turning to FIG. 9, to support simultaneous read and write to the sub-array 706 in the Ultra-Deep Compute SRAM 700, the read address and write address are separate and the Most Significant Bit (A10) for the read address and the write address are of opposite polarity. The Most Significant Bit (A10) is used in decoder enable circuitry 902 to determine which of the two addresses (read address or write address) is sent to the left side 450 of sub-array 406 (FIG. 4B) and the right side 452 of sub-array 406 (FIG. 4B). The state of a sub-array side select signal 922 output by the decoder enable circuitry 902 is used to enable the read/write operation. The exclusive-OR (XOR) logic gate 908 in the decoder enable circuitry 902 is shared by the left side 450 of sub-array 406 (FIG. 4B) and the right side 452 of sub-array 406 (FIG. 4B). The multiplexors (MUX) 910 in the decoder enable circuitry 902 and the Read/Write Address Circuitry 920 is duplicated in the two sides of the sub-array 706.

The Read/Write Address Circuitry 920 includes a read pre-decoder 904, a write pre-decoder 906, a write 8:256 decoder 912 and a read 8:256 decoder 914. The state of the output signal from exclusive-OR (XOR) logic gate 908 indicates whether the Most Significant Bit (A10) for the read address and the write address are of opposite polarity. The state of address bits A1:A0 are used as select signals for the read pre-decoder 904 or the write pre-decoder 906 and the eight higher address bits (A9:A2) are used as inputs to the read 8:256 decoder 912 or the write 8:256 decoder 912 to select the location (WL) in the SRAM to be read or written.

To support a one-side read or write to the sub-array 706 in the Ultra-Deep Compute SRAM 700, the Most Significant Bit (A10) for the read address and the write address are of the same polarity. The state of the output signal from exclusive-OR (XOR) logic gate 908 indicates whether the Most Significant Bit (A10) for the read address and the write address are of the same polarity. Simultaneous Read and Write is possible only when the polarity of the Most Significant Bit of respective addresses are complementary (that is, one is logical '1' and the other is logical '0'). The decoder enable circuitry 902 enables decoders in both or one of the first group of sub-arrays 404a and the second group of sub-arrays 404b.

Turning to FIG. 10, control circuitry 1002 ensures the correct polarity for the Most Significant Bit (A10) for the read address and the write address to allow concurrent read and write operations to the left side 450 of sub-array 706 and the right side 452 of sub-array 706 in the SRAM sub-array 706 to allow the Multiply-and-Accumulate (MAC) units 1004 to be fully utilized in all clock cycles.

Table 2 illustrates an example of read/write operations in the SRAM sub-array 706 in which input activations/weights 1006 are stored in the left side 450 of sub-array 706 and partial products/output activations are stored in the right side 452 of sub-array 706.

TABLE 2

| Clk1 | Read Activations & Weights (1) | |
|---|---|---|
| Clk2 | Read Activations & Weights (2) | Write Output Activations (1) |
| Clk3 | Read Activations & Weights (3) | Write Output Activations (2) |

During the first clock cycle (Clk1), activations and weights (1) stored in input activations/weights 1006 in the left side 450 of sub-array 706 are read by the Multiply-and-Accumulate (MAC) units 1004.

During the second clock cycle (Clk2), activations and weights (2) stored in input activations/weights 1006 in the left side 450 of sub-array 406 are read by the Multiply-and-Accumulate (MAC) units 1004 and write output activations (1) (the result of the operation(s) performed by the Multiply-and-Accumulate (MAC) units 1004 using the activations and weights (1)) are written to in the right side 452 of sub-array 706.

During the third clock cycle (Clk3), activations and weights (3) stored in input activations/weights 1006 in the left side 450 of sub-array 706 are read by the Multiply-and-Accumulate (MAC) units 1004 and write output activations (2) (the result of the operation(s) performed by the Multiply-and-Accumulate (MAC) units 1004 using the activations and weights (2)) are written to in the right side 452 of sub-array 706.

Figure 11:
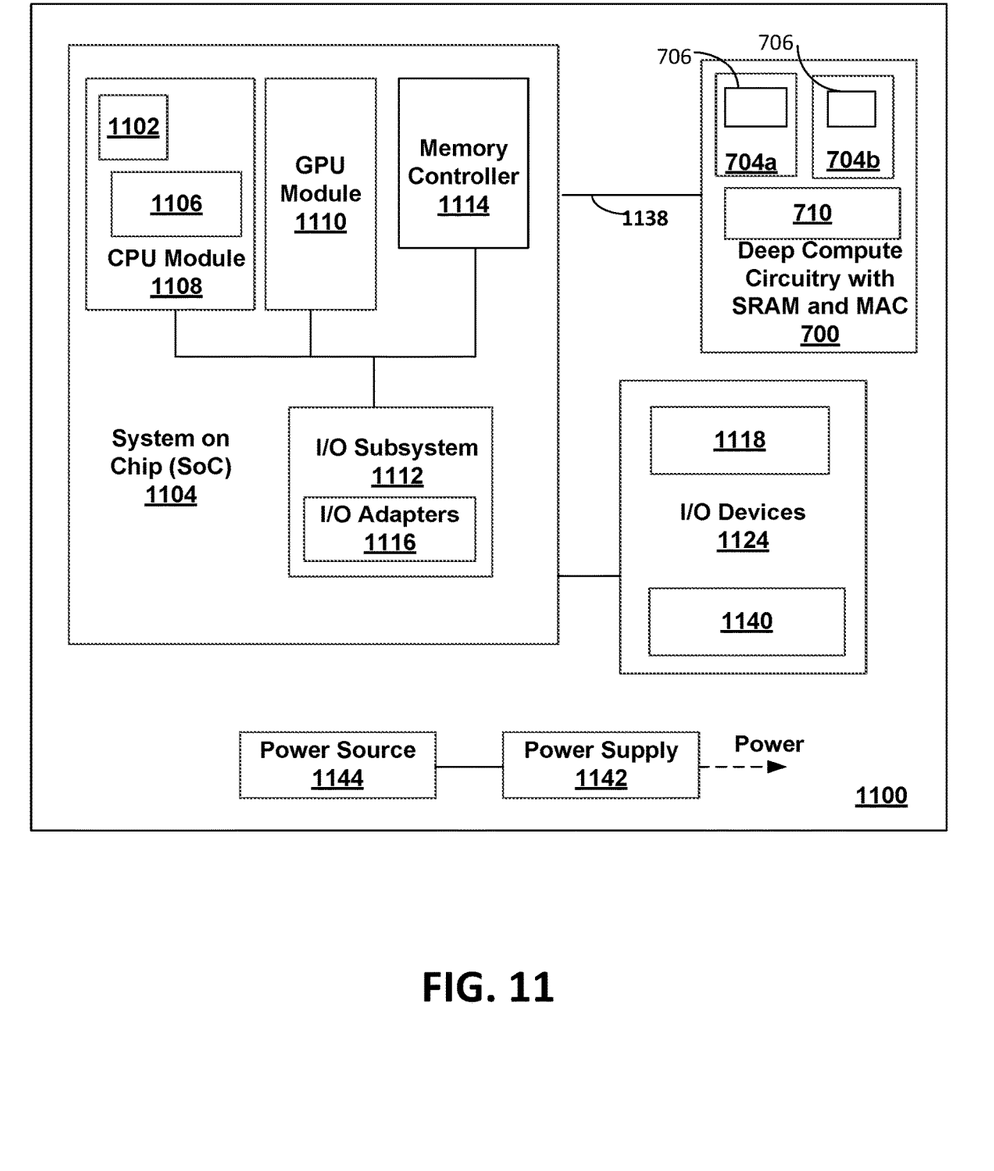
FIG. 11 is a block diagram of an embodiment of a computer system that includes the Ultra-Deep Compute SRAM.

FIG. 11 is a block diagram of an embodiment of a computer system 1100 that includes the Ultra-Deep Compute SRAM 700. Computer system 1100 may correspond to a computing device including, but not limited to, a server, a workstation computer, a desktop computer, a laptop computer, and/or a tablet computer.

The computer system 1100 includes a system on chip (SOC or SoC) 1104 which combines processor, graphics, memory, and Input/Output (I/O) control logic into one SoC package. The SoC 1104 includes at least one Central Processing Unit (CPU) module 1108, a memory controller 1114, and a Graphics Processor Unit (GPU) 1110. In other embodiments, the memory controller 1114 may be external to the SoC 1104. Although not shown, each of the processor core(s) 1102 may internally include one or more instruction/data caches, execution units, prefetch buffers, instruction queues, branch address calculation units, instruction decoders, floating point units, retirement units, etc. The CPU module 1108 may correspond to a single core or a multi-core general purpose processor, such as those provided by Intel® Corporation, according to one embodiment.

In an embodiment, the Ultra-Deep Compute SRAM 700 is external to the SoC 1104. In other embodiments, the Ultra-Deep Compute SRAM 700 may be included in the SoC 1104. The Ultra-Deep Compute SRAM 700 includes a first group of sub-arrays 404a, a second group of sub-arrays 404b and Multiply-and-Accumulate (MAC) units 720.

The Graphics Processor Unit (GPU) 1110 may include one or more GPU cores and a GPU cache which may store graphics related data for the GPU core. The GPU core may internally include one or more execution units and one or more instruction and data caches. Additionally, the Graphics Processor Unit (GPU) 1110 may contain other graphics logic units that are not shown in FIG. 11, such as one or more vertex processing units, rasterization units, media processing units, and codecs.

Within the I/O subsystem 1112, one or more I/O adapter(s) 1116 are present to translate a host communication protocol utilized within the processor core(s) 1102 to a protocol compatible with particular I/O devices. Some of the protocols that adapters may be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 1116 may communicate with external I/O devices 1124 which may include, for example, user interface device(s) including a display and/or a touch-screen display 1140, printer, keypad, keyboard, communication logic, wired and/or wireless, storage device(s) including hard disk drives ("HDD"), solid-state drives ("SSD") 1118, removable storage media, Digital Video Disk (DVD) drive, Compact Disk (CD) drive, Redundant Array of Independent Disks (RAID), tape drive or other storage device. The storage devices may be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there may be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

Power source 1144 provides power to the components of system 1100. More specifically, power source 1144 typically interfaces to one or multiple power supplies 1142 in computer system 1100 to provide power to the components of computer system 1100. In one example, power supply 1142 includes an AC to DC (alternating current to direct current) adapter to plug into a wall outlet. Such AC power can be renewable energy (e.g., solar power) power source 1144. In one example, power source 1144 includes a DC power source, such as an external AC to DC converter. In one example, power source 1144 or power supply 1142 includes wireless charging hardware to charge via proximity to a charging field. In one example, power source 1144 can include an internal battery or fuel cell source.

With Horizontal-Vertical SRAM technology, Ultra-Deep Compute SRAM (UDC-SRAM) capability can be achieved that is very close to a theoretical maximum. Compared to baseline Deep Compute SRAM of sixteen compute units, a twelve times increase can be achieved using two hundred and fifty six compute units with 0.75 clock frequency scaling for every 256 KB of SRAM. The theoretical maximum is a sixteen times increase in compute for every 256 KB of memory with 16 KB sub-arrays.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. A memory device comprising:
    a memory circuit including a plurality of groups of sub-arrays of Static Random Access Memory (SRAM) cells to store data; and
    a plurality of Multiply-and-Accumulate units, each of the plurality of Multiply-and-Accumulate units to perform a multiply-and-accumulate operation on data stored in the memory circuit, the data to be routed on metal tracks in the memory circuit in the memory device between the plurality of Multiply-and-Accumulate units and the plurality of groups of sub-arrays of SRAM cells in both a vertical direction and a horizontal direction, the Multiply-and-Accumulate units placed in both the horizontal direction and the vertical direction to achieve a symmetric layout.

2. The memory device of claim 1, wherein the plurality of groups of sub-arrays of SRAM cells includes a first group of sub-arrays of SRAM cells and a second group of sub-arrays of SRAM cells, a first data to be read from the first group of sub-arrays of SRAM cells while a second data is to be written to the second group of sub-arrays of SRAM cells.

3. The memory device of claim 2, wherein each sub-array of SRAM cells includes a left sub-array and a right sub-array, the first data to be read from the left sub-array while the second data is to be written to the right sub-array.

4. The memory device of claim 3, wherein input activations/weights are stored in the left sub-array and partial products/output activations are stored in the right sub-array.

5. The memory device of claim 3, further comprising:
    a network on chip (NOC) coupled to the plurality of Multiply-and-Accumulate units and the plurality of groups of sub-arrays of SRAM cells to allow the data to be routed between the plurality of Multiply-and-Accumulate units such that an output of a first MAC unit to be routed to an input of a second MAC unit.

6. The memory device of claim 5, wherein the plurality of groups of sub-arrays of SRAM cells is 8 Megabytes, and a number of Multiply-and-Accumulate units is 256.

7. A method comprising:
    storing data in a memory circuit in a memory device, the memory circuit including a plurality of groups of sub-arrays of Static Random Access Memory (SRAM) cells; and
    performing, in a plurality of Multiply-and-Accumulate units in the memory device, a multiply-and-accumulate operation on data stored in the memory circuit, the data to be routed on metal tracks in the memory circuit in the memory device between the plurality of Multiply-and-Accumulate units and the plurality of groups of sub-arrays of SRAM cells in both a vertical direction and a horizontal direction, the Multiply-and-Accumulate units placed in both the horizontal direction and the vertical direction to achieve a symmetric layout.

8. The method of claim 7, wherein the plurality of groups of sub-arrays of SRAM cells includes a first group of sub-arrays of SRAM cells and a second group of sub-arrays of SRAM cells, a first data to be read from the first group of sub-arrays of SRAM cells while a second data is to be written to the second group of sub-arrays of SRAM cells.

9. The method of claim 8, wherein each sub-array of SRAM cells includes a left sub-array and a right sub-array, the first data to be read from the left sub-array while the second data is to be written to the right sub-array.

10. The method of claim 9, wherein input activations/weights are stored in the left sub-array and partial products/output activations are stored in the right sub-array.

11. The method of claim 9, further comprising:
routing the data between the plurality of Multiply-and-Accumulate units and the plurality of groups of sub-arrays of SRAM cells via a network on chip (NOC) coupled to the plurality of Multiply-and-Accumulate units and the plurality of groups of sub-arrays of SRAM cells such that an output of a first MAC unit to be routed to an input of a second MAC unit.

12. The method of claim 11, wherein the plurality of groups of sub-arrays of SRAM cells is 8 Megabytes, and a number of Multiply-and-Accumulate units is 256.

13. A system comprising:
a memory device comprising:
a memory circuit including a plurality of groups of sub-arrays of Static Random Access Memory (SRAM) cells to store data; and
a plurality of Multiply-and-Accumulate units, each of the plurality of Multiply-and-Accumulate units to perform a multiply-and-accumulate operation on data stored in the memory circuit, the data to be routed on metal tracks in the memory circuit in the memory device between the plurality of Multiply-and-Accumulate units and the plurality of groups of sub-arrays of SRAM cells in both a vertical direction and a horizontal direction, the Multiply-and-Accumulate units placed in both the horizontal direction and the vertical direction to achieve a symmetric layout; and
a battery to power the system.

14. The system of claim 13, wherein the plurality of groups of sub-arrays of SRAM cells includes a first group of sub-arrays of SRAM cells and a second group of sub-arrays of SRAM cells, a first data to be read from the first group of sub-arrays of SRAM cells while a second data is to be written to the second group of sub-arrays of SRAM cells.

15. The system of claim 14, wherein each sub-array of SRAM cells includes a left sub-array and a right sub-array, the first data to be read from the left sub-array while the second data is to be written to the right sub-array.

16. The system of claim 15, wherein input activations/weights are stored in the left sub-array and partial products/output activations are stored in the right sub-array.

17. The system of claim 15, further comprising:
a network on chip (NOC) coupled to the plurality of Multiply-and-Accumulate units and the plurality of groups of sub-arrays of SRAM cells to allow the data to be routed between the plurality of Multiply-and-Accumulate units such that an output of a first MAC unit to be routed to an input of a second MAC unit.

18. The system of claim 17, wherein the plurality of groups of sub-arrays of SRAM cells is 8 Megabytes, and a number of Multiply-and-Accumulate units is 256.

* * * * *